United States Patent
Miller et al.

(10) Patent No.: US 9,587,993 B2
(45) Date of Patent: Mar. 7, 2017

(54) PROBE ASSEMBLY FOR A FLUID BED REACTOR

(71) Applicant: REC Silicon Inc, Moses Lake, WA (US)

(72) Inventors: Matthew Miller, Moses Lake, WA (US); Michael V. Spangler, Soap Lake, WA (US); Barry Wemp, Moses Lake, WA (US); E. Wayne Osborne, Moses Lake, WA (US)

(73) Assignee: REC Silicon Inc, Moses Lake, WA (US)

( * ) Notice: Subject to any disclaimer, the term of this patent is extended or adjusted under 35 U.S.C. 154(b) by 879 days.

(21) Appl. No.: 13/670,200

(22) Filed: Nov. 6, 2012

(65) Prior Publication Data

US 2014/0123896 A1    May 8, 2014

(51) Int. Cl.
*G01K 7/02* (2006.01)
*C23C 16/442* (2006.01)
*C23C 16/455* (2006.01)

(52) U.S. Cl.
CPC .............. *G01K 7/02* (2013.01); *C23C 16/442* (2013.01); *C23C 16/45519* (2013.01)

(58) Field of Classification Search
CPC .... G01K 7/02; C23C 16/442; C23C 16/45519
USPC ................................... 118/DIG. 5
See application file for complete search history.

(56) References Cited

U.S. PATENT DOCUMENTS

| | | | |
|---|---|---|---|
| 2,815,663 A * | 12/1957 | Lupfer | G01F 23/04 136/230 |
| 3,012,861 A | 12/1961 | Ling | |
| 3,012,862 A | 12/1961 | Bertrand et al. | |
| 3,339,411 A * | 9/1967 | Riffie | G01F 23/242 174/151 |
| 3,343,417 A * | 9/1967 | Peek, Jr. | G01K 13/02 374/143 |
| 3,459,040 A * | 8/1969 | Halbach | G01K 17/00 374/35 |

(Continued)

FOREIGN PATENT DOCUMENTS

WO    WO 2012-054184    4/2012

OTHER PUBLICATIONS

The Measurement, Instrumentation, and Sensors: Handbook, John G. Webster, Springer Science & Business Media, 1999—Technology & Engineering—1500 pages, p. 29-6 https://books.google.com/books?id=b7UuZzf9ivlC&lpg=SA29-PA6&dq=pressure%20tap &pg=SA29-PA6#v=onepage&q=pressure%20tap&f=false.*

(Continued)

*Primary Examiner* — Rudy Zervigon
(74) *Attorney, Agent, or Firm* — Klarquist Sparkman, LLP

(57) ABSTRACT

Embodiments of a probe assembly for a fluid bed reactor are disclosed. The probe assembly includes a fluid bed reactor (FBR) member, and a pressure tap comprising a wall defining a passageway within which the FBR member is located. Exemplary FBR members include, but are not limited to, a thermocouple, a seed pipe, a particle sampling line, a gas sampling line, a gas feed line, a heater, a second pressure tap, or a combination thereof. Disclosed embodiments of the probe assembly reduce or eliminate the need for support rods and rings within the fluid bed reactor, reduce component fouling within the reactor, and/or reduce product contamination.

18 Claims, 5 Drawing Sheets

(56) References Cited

U.S. PATENT DOCUMENTS

| | | | | |
|---|---|---|---|---|
| 3,596,518 A * | 8/1971 | Kirkpatrick | ............ | G01K 13/02 374/134 |
| 3,619,381 A * | 11/1971 | Fitterer | ............. | G01N 27/4118 204/423 |
| 3,630,080 A * | 12/1971 | Taylor | .................... | F16L 29/00 374/142 |
| 3,802,926 A * | 4/1974 | Blencowe | ................ | G01K 1/08 136/230 |
| 3,921,452 A * | 11/1975 | Sartorius | .................. | G01K 1/14 374/179 |
| 3,983,756 A * | 10/1976 | Danguillier | ............. | G01K 1/14 137/317 |
| 4,217,463 A * | 8/1980 | Swearingen | ............ | G01K 7/02 136/230 |
| 4,290,306 A * | 9/1981 | Murakami | .................. | C21C 5/4673 266/99 |
| 4,314,525 A | 2/1982 | Hsu et al. | | |
| 4,416,913 A | 11/1983 | Ingle et al. | | |
| 4,444,516 A * | 4/1984 | Dostoomian | ........ | G01J 5/0037 356/44 |
| 4,460,802 A * | 7/1984 | Benedict | ................. | G01K 7/06 136/230 |
| 4,519,810 A * | 5/1985 | Haas | ........................ | C10J 3/54 406/142 |
| 4,623,400 A * | 11/1986 | Japka | ..................... | C23C 16/442 148/283 |
| 4,765,751 A * | 8/1988 | Pannone | ................. | F01D 17/02 374/135 |
| 4,788,871 A * | 12/1988 | Nelson | ..................... | A23L 3/10 374/143 |
| 4,820,587 A | 4/1989 | Gautreaux et al. | | |
| 4,868,013 A | 9/1989 | Allen | | |
| 4,883,687 A | 11/1989 | Gautreaux et al. | | |
| 4,899,741 A * | 2/1990 | Bentley | ................. | A61B 18/28 374/141 |
| 4,974,455 A * | 12/1990 | McGowan | ........... | G01N 1/2258 73/863.12 |
| 5,005,986 A * | 4/1991 | Najjar | ..................... | G01K 1/10 136/230 |
| 5,077,028 A | 12/1991 | Age | | |
| 5,131,759 A * | 7/1992 | Eiermann | ................ | G01K 7/22 374/185 |
| 5,139,762 A | 8/1992 | Flagella | | |
| 5,254,168 A * | 10/1993 | Littman | .................. | A61J 3/005 118/20 |
| 5,295,747 A * | 3/1994 | Vinci | ....................... | F01P 11/14 374/145 |
| 5,312,186 A * | 5/1994 | Swan | ..................... | G01K 13/12 374/143 |
| 5,423,610 A * | 6/1995 | Stansfeld | ............... | G01K 13/02 136/230 |
| 5,520,682 A * | 5/1996 | Baust | ..................... | A61B 18/02 606/20 |
| 5,733,510 A * | 3/1998 | Chinh | ..................... | B01J 8/1809 422/138 |
| 5,798,137 A | 8/1998 | Lord et al. | | |
| 5,810,934 A | 9/1998 | Lord et al. | | |
| 5,852,236 A * | 12/1998 | Honda | ..................... | G01P 5/12 73/170.15 |
| 5,855,678 A * | 1/1999 | Sanjurjo | ................ | B01J 8/1836 118/715 |
| 6,073,492 A * | 6/2000 | Rosselson | ........... | G01F 23/2961 73/1.83 |
| 6,189,390 B1 * | 2/2001 | Platt | ........................ | G01F 1/363 73/756 |
| 6,231,230 B1 * | 5/2001 | Baldock | ................. | G01K 1/146 374/179 |
| 6,299,349 B1 * | 10/2001 | Steinel | ..................... | B29C 45/77 374/143 |
| 6,354,734 B1 * | 3/2002 | Curran | .................... | E21B 47/06 374/138 |
| 6,759,489 B1 * | 7/2004 | Turkistani | ................ | C08F 2/34 526/348.5 |
| 7,029,632 B1 | 4/2006 | Weidhaus et al. | | |
| 7,111,982 B1 * | 9/2006 | Swonger, Jr. | .......... | G01K 13/02 374/143 |
| 7,922,990 B2 | 4/2011 | Hertlein et al. | | |
| 8,075,692 B2 | 12/2011 | Osborne et al. | | |
| 2002/0006368 A1 * | 1/2002 | Becker | ................... | B01J 8/1818 422/211 |
| 2002/0048311 A1 * | 4/2002 | Norrbakhsh | ............ | C30B 25/16 374/141 |
| 2002/0081250 A1 | 6/2002 | Lord | | |
| 2002/0086530 A1 | 7/2002 | Kim et al. | | |
| 2002/0102850 A1 | 8/2002 | Kim et al. | | |
| 2003/0067960 A1 * | 4/2003 | Nyffenegger | ............ | G01K 1/16 374/143 |
| 2003/0201842 A1 * | 10/2003 | Gard | ..................... | G01F 23/268 333/24 R |
| 2004/0227636 A1 * | 11/2004 | Gul | .......................... | G01K 1/08 340/620 |
| 2005/0092245 A1 * | 5/2005 | Moon | ............... | C23C 16/45512 118/715 |
| 2005/0245920 A1 * | 11/2005 | Vitullo | ................... | A61B 18/18 606/33 |
| 2008/0056979 A1 | 3/2008 | Arvidson et al. | | |
| 2008/0159942 A1 | 7/2008 | Berthold et al. | | |
| 2008/0220166 A1 | 9/2008 | Ege et al. | | |
| 2008/0241046 A1 | 10/2008 | Hertlein et al. | | |
| 2008/0299291 A1 | 12/2008 | Weidhaus et al. | | |
| 2009/0004090 A1 | 1/2009 | Kim et al. | | |
| 2009/0324479 A1 | 12/2009 | Kulkarni et al. | | |
| 2010/0044342 A1 | 2/2010 | Kim et al. | | |
| 2010/0047136 A1 | 2/2010 | Kim et al. | | |
| 2010/0068116 A1 | 3/2010 | Kim et al. | | |
| 2010/0215562 A1 | 8/2010 | Sanchez et al. | | |
| 2011/0232378 A1 * | 9/2011 | Tavares | .................. | G01K 13/02 73/170.02 |
| 2012/0082592 A1 * | 4/2012 | Jung | ...................... | B01J 8/1836 422/146 |
| 2012/0269686 A1 * | 10/2012 | Jung | ...................... | B01J 8/1818 422/139 |
| 2012/0269687 A1 * | 10/2012 | Jung | ...................... | B01J 8/1818 422/146 |
| 2012/0269712 A1 * | 10/2012 | Jung | ...................... | B01J 19/2415 423/348 |
| 2013/0129570 A1 * | 5/2013 | Jung | ...................... | B01J 8/1809 422/119 |
| 2014/0123896 A1 * | 5/2014 | Miller | ................... | C23C 16/442 118/712 |

OTHER PUBLICATIONS http://www.alibaba.com, "Thermocouple pressure transmitter," product search, 4 pgs, retrieved May 7, 2012.

International Search Report and Written Opinion, dated Dec. 27, 2013, issued in corresponding International Application No. PCT/US2013/068474.

* cited by examiner

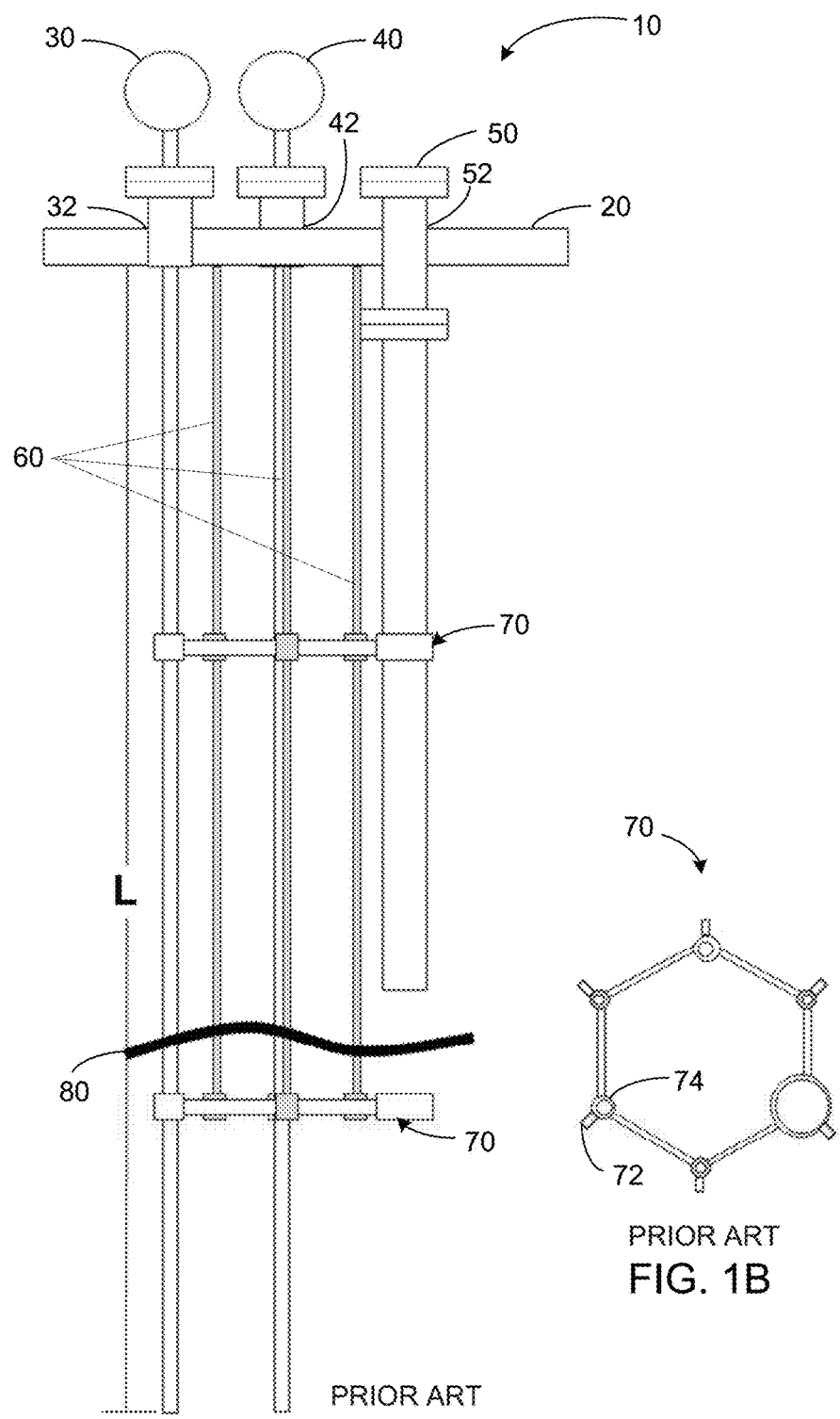
PRIOR ART
FIG. 1A
PRIOR ART
FIG. 1B

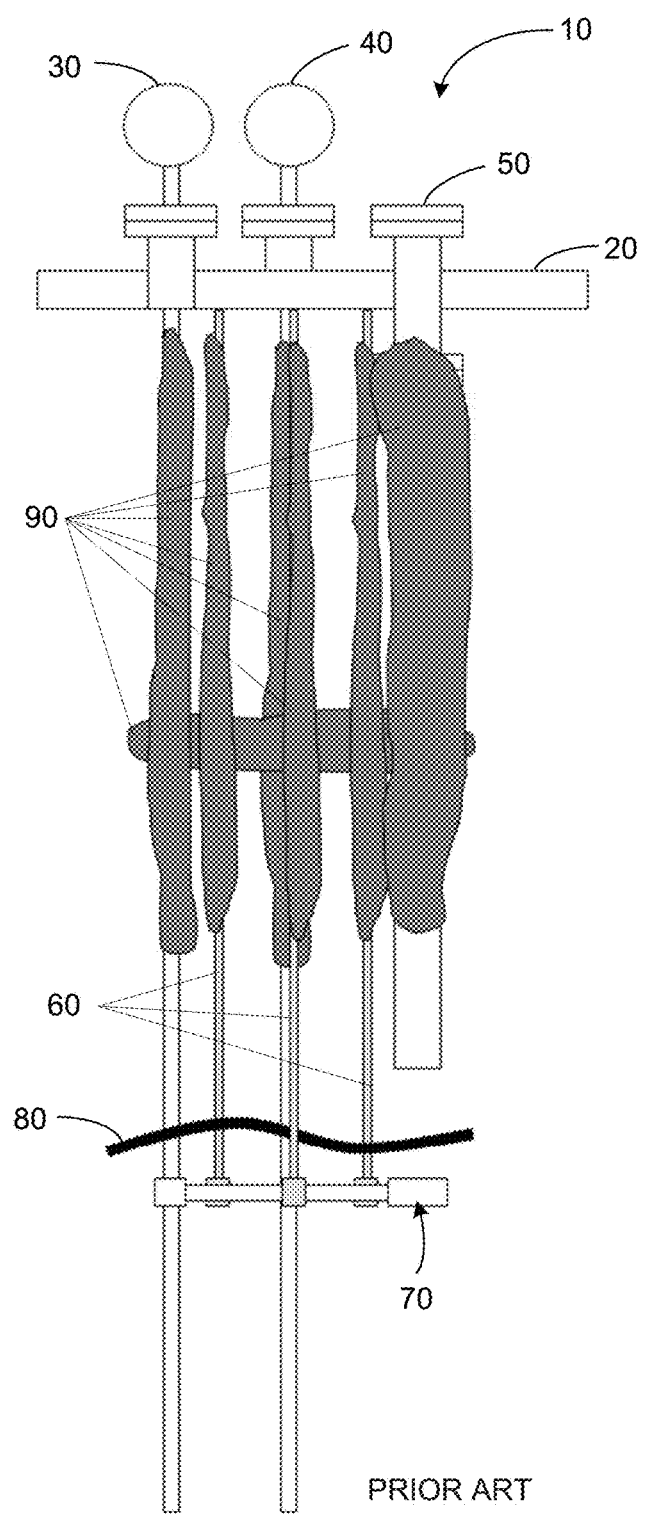
PRIOR ART
FIG. 2

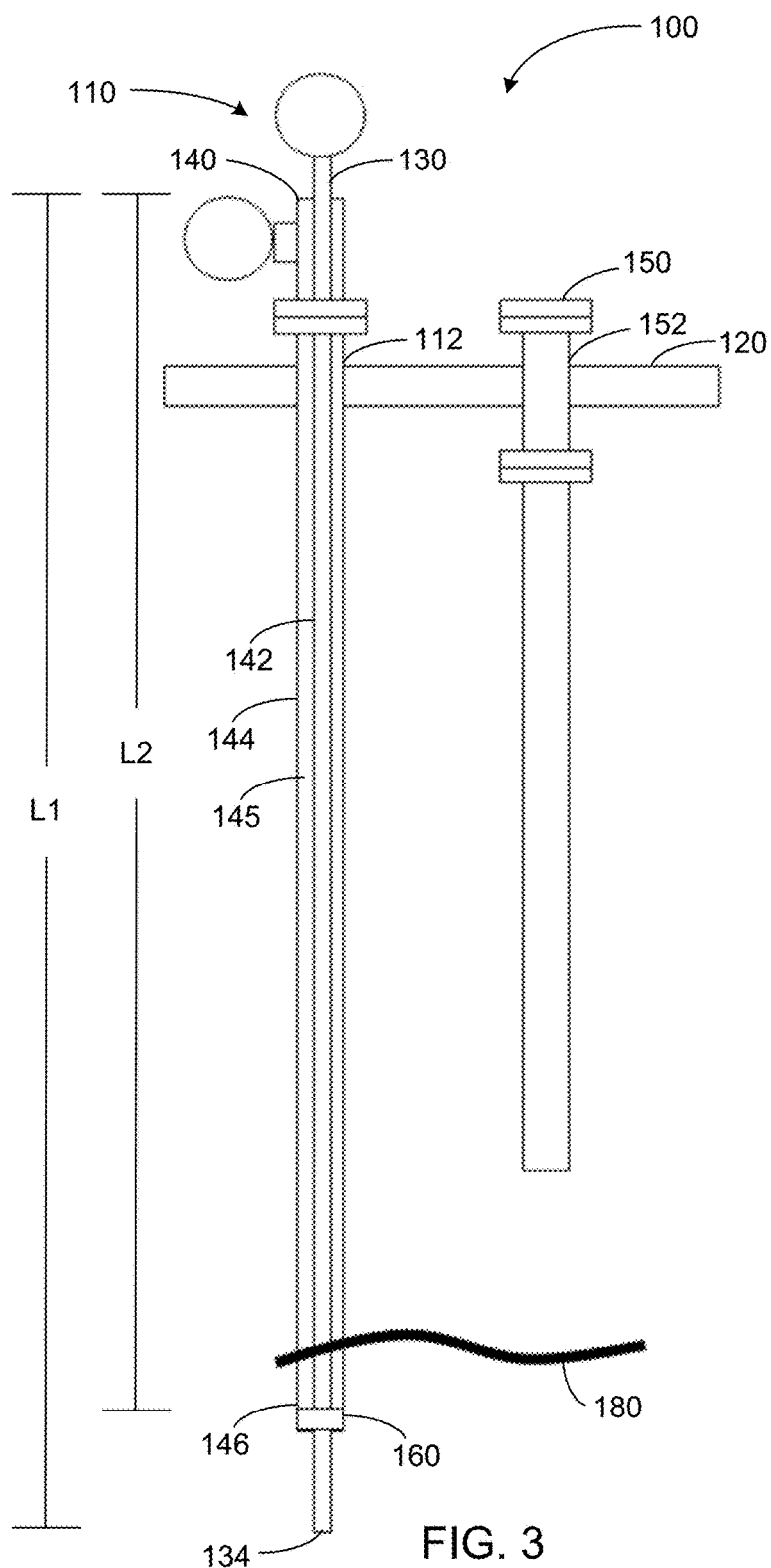
FIG. 3

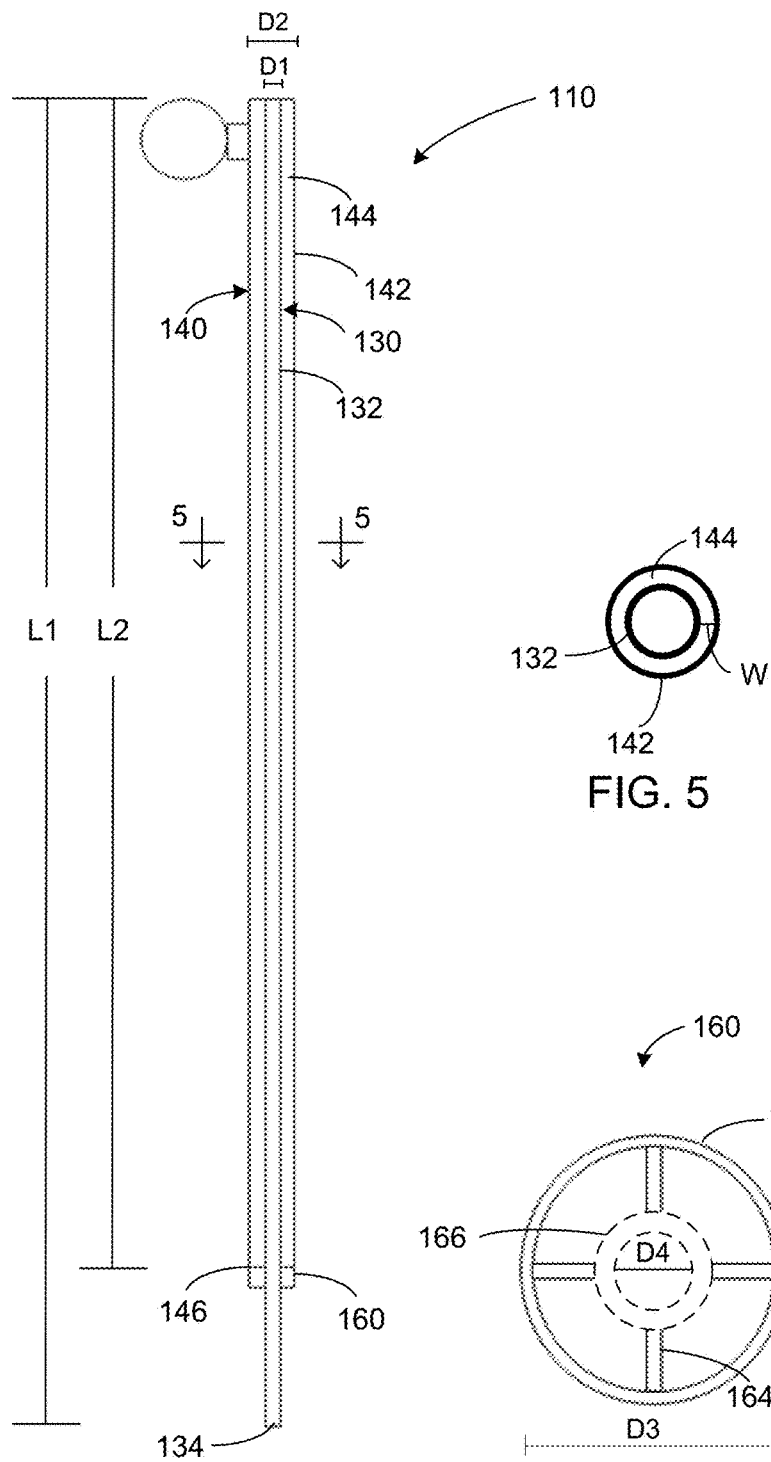

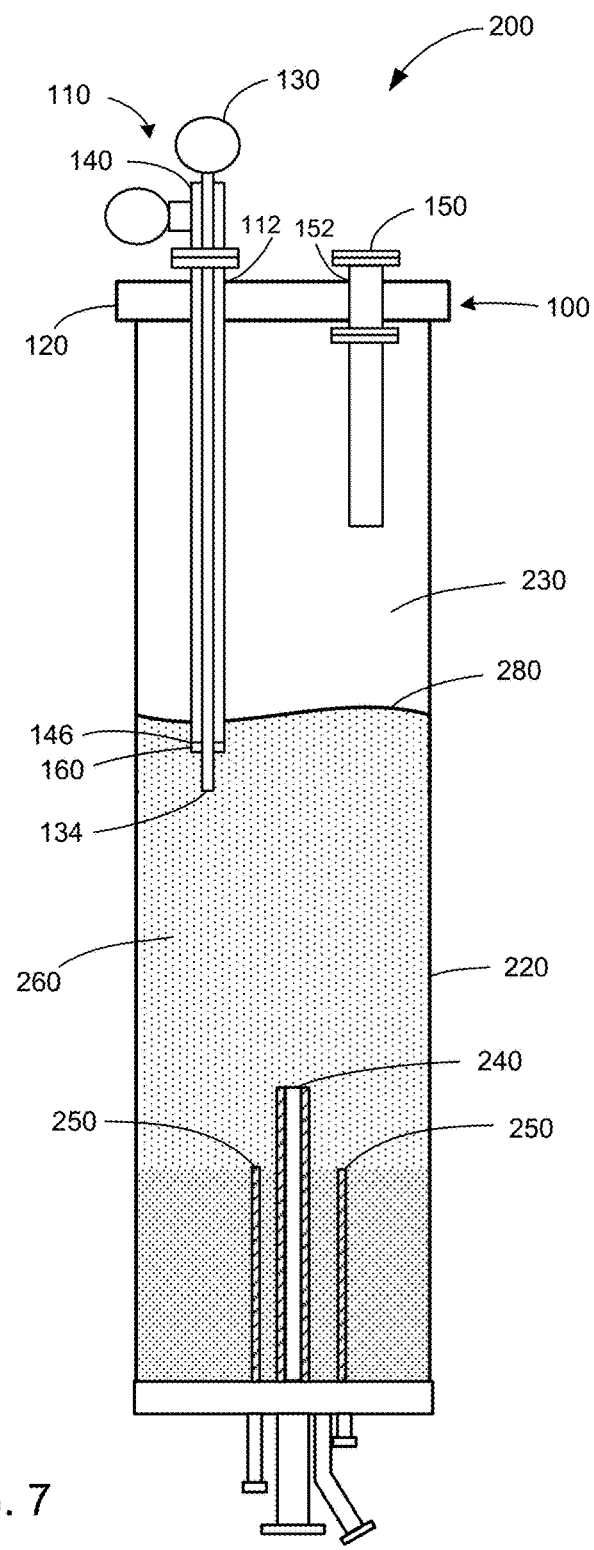
FIG. 7

US 9,587,993 B2

PROBE ASSEMBLY FOR A FLUID BED REACTOR

FIELD

The present disclosure relates to a probe assembly for use with a fluid bed reactor, particularly a fluid bed reactor for pyrolytic decomposition of a silicon- or germanium-bearing gas to produce silicon- or germanium-coated particles, the probe assembly including a fluid bed reactor member and a pressure tap.

BACKGROUND

Pyrolytic decomposition of silicon-bearing gas in fluidized beds is an attractive process for producing polysilicon for the photovoltaic and semiconductor industries due to excellent mass and heat transfer, increased surface for deposition, and continuous production. Compared with a Siemens-type reactor, the fluid bed reactor offers considerably higher production rates at a fraction of the energy consumption. The fluid bed reactor can be continuous and highly automated to significantly decrease labor costs.

A common problem in fluid bed reactors is fouling of interior components and surrounding reactor walls as silicon deposits form on the walls, temperature probe, pressure tap, seed nozzle, gas nozzles, and interior support structures. Another common problem is contamination of the fluid bed at high operating temperatures by materials used to construct the reactor and its components. For example, nickel has been shown to diffuse into a silicon layer from the base metal in some nickel alloys. Similar problems arise in fluid bed reactors configured for pyrolytic decomposition of a germanium-bearing gas to produce germanium-coated particles.

SUMMARY

Embodiments of a probe assembly for a fluid bed reactor are disclosed. The probe assembly includes a fluid bed reactor (FBR) member and a pressure tap. The FBR member has an outer surface, a maximum outer transverse dimension D1, a distal end, and a length L1. The pressure tap has a wall defining a passageway, a maximum outer transverse dimension D2 where D2>D1, a distal end, and a length L2. The pressure tap wall is spaced apart from the outer surface of the FBR member to define a space between the FBR member and the pressure tap wall. The FBR member is located within the passageway defined by the pressure tap wall.

In some embodiments, the FBR member is one or more of a thermocouple, a seed pipe, a particle sampling line, a gas sampling line, a gas feed line, a heater, or a second pressure tap. In one embodiment, L1 is greater than L2 such that the distal end of the FBR member is located below the distal end of the pressure tap wall when the probe assembly is installed in a fluid bed reactor with the probe assembly extending downwardly into a reaction chamber of the fluid bed reactor. In another embodiment, L1 is less than or equal to L2 such that the distal end of the FBR member is located at or above the distal end of the pressure tap wall when the probe assembly is installed in a fluid bed reactor with the probe assembly extending downwardly into a reaction chamber of the fluid bed reactor. In some arrangements, L2 has a sufficient length for the distal end of the pressure tap to extend into a fluidized portion of a fluid bed within the fluid bed reactor when the pressure tap is positioned such that it extends through an aperture in a top head of the fluid bed reactor and the fluid bed reactor is in operation.

In some embodiments, the probe assembly further includes a support proximate a distal end of the outer wall of the pressure tap. The support may include an outer member having a maximum outer transverse dimension D3 (advantageously D3≤D2), and a plurality of spacer rods extending inwardly from the outer member. The support centrally positions and mechanically stabilizes the inner pipe within the outer wall.

Desirably, the probe assembly, or a portion thereof, comprises high-temperature stainless steel, a nickel-iron-chromium alloy, or an iron-chromium-nickel-molybdenum alloy, or a cobalt-based superalloy. In certain arrangements, exposed outer surfaces of the probe assembly include a coating comprising a cobalt-chromium alloy, tungsten carbide/cobalt, tungsten carbide/nickel boron, silicon carbide, or silicon nitride.

An exemplary top head assembly includes a top head including at least one aperture extending through the top head, and a probe assembly positioned so that it extends through the aperture. Embodiments of the disclosed probe assembly are suitable for use in a fluid bed reactor, such as a fluid bed reactor comprising a vessel, a plurality of seed particles within the vessel, and a gas source. In some embodiments, the gas source is a silicon-bearing gas source and the reactor is configured to produce silicon-coated particles by pyrolytic decomposition of the silicon-bearing gas and deposition of silicon onto the seed particles, such as onto silicon seed particles. In certain embodiments, the FBR member is a thermocouple having a length greater than a length of the pressure tap.

The foregoing and other objects, features, and advantages of the invention will become more apparent from the following detailed description, which proceeds with reference to the accompanying figures.

BRIEF DESCRIPTION OF THE DRAWINGS

FIG. 1A is a schematic elevational view of one embodiment of a top head assembly for a fluid bed reactor.

FIG. 1B is a top plan view of a support ring of the top head assembly of FIG. 1A.

FIG. 2 is a schematic elevational view of the top head assembly of FIG. 1 after fouling from silicon deposition.

FIG. 3 is a schematic elevational view of an exemplary embodiment of a top head assembly including a probe assembly for a fluid bed reactor.

FIG. 4 is a schematic elevational view of the probe assembly of FIG. 3.

FIG. 5 is a cross-sectional view of the probe assembly of FIG. 4.

FIG. 6 is a top plan view of a support structure of the probe assembly of FIG. 4.

FIG. 7 is a schematic elevational view of one embodiment of a fluid bed reactor including the probe assembly of FIG. 3.

DETAILED DESCRIPTION

Disclosed herein are embodiments of a probe assembly for use in a fluid bed reactor system, such as a fluid bed reactor system for the formation of polysilicon by pyrolytic decomposition of a silicon-bearing gas and deposition of silicon onto fluidized silicon particles or other seed particles (e.g., silica, graphite, or quartz particles), or a fluid bed reactor system for the formation of germanium-coated particles by pyrolytic decomposition of a germanium-bearing gas and deposition of germanium onto fluidized germanium particles or other seed particles. Embodiments of the disclosed probe assembly are suitable for insertion through a top head or bottom head of a fluid bed reactor, and are suitable for use in fluid bed reactors having a non-metallic liner, such as a ceramic liner or a quartz liner. The probe assembly combines a fluid bed reactor (FBR) member and a pressure tap.

Although the disclosed probe assembly is suitable for use in many types of fluid bed reactors, the discussion will proceed with a focus on fluid bed reactors configured for silicon deposition. The manufacture of particulate polycrystalline silicon by a chemical vapor deposition method involving pyrolysis of a silicon-containing substance such as for example silane, disilane or halosilanes such as trichlorosilane or tetrachlorosilane in a fluidized bed reactor is well known to a person skilled in the art and exemplified by many publications including the following patents and publications: U.S. Pat. No. 8,075,692, U.S. Pat. No. 7,029,632, U.S. Pat. No. 5,855,678, U.S. Pat. No. 5,810,934, U.S. Pat. No. 5,798,137, U.S. Pat. No. 5,139,762, U.S. Pat. No. 5,077,028, U.S. Pat. No. 4,883,687, U.S. Pat. No. 4,868,013, U.S. Pat. No. 4,820,587, U.S. Pat. No. 4,416,913, U.S. Pat. No. 4,314,525, U.S. Pat. No. 3,012,862, U.S. Pat. No. 3,012,861, US2010/0215562, US2010/0068116, US2010/0047136, US2010/0044342, US2009/0324479, US2008/0299291, US2009/0004090, US2008/0241046, US2008/0056979, US2008/0220166, US 2008/0159942, US2002/0102850, US2002/0086530, and US2002/0081250.

Silicon is deposited on particles in a reactor by decomposition of a silicon-bearing gas selected from the group consisting of silane ($SiH_4$), disilane ($Si_2H_6$), higher order silanes ($Si_nH_{2n+2}$), dichlorosilane ($SiH_2Cl_2$), trichlorosilane ($SiHCl_3$), silicon tetrachloride ($SiCl_4$), dibromosilane ($SiH_2Br_2$), tribromosilane ($SiHBr_3$), silicon tetrabromide ($SiBr_4$), diiodosilane ($SiH_2I_2$), triiodosilane ($SiHI_3$), silicon tetraiodide ($SiI_4$), and mixtures thereof. The silicon-bearing gas may be mixed with one or more halogen-containing gases, defined as any of the group consisting of chlorine ($Cl_2$), hydrogen chloride (HCl), bromine ($Br_2$), hydrogen bromide (HBr), iodine ($I_2$), hydrogen iodide (HI), and mixtures thereof. The silicon-bearing gas may also be mixed with one or more other gases, including hydrogen ($H_2$) or one or more inert gases selected from nitrogen ($N_2$), helium (He), argon (Ar), and neon (Ne). In particular embodiments, the silicon-bearing gas is silane, and the silane is mixed with hydrogen.

The silicon-bearing gas, along with any accompanying hydrogen, halogen-containing gases and/or inert gases, is introduced into a fluidized bed reactor and thermally decomposed within the reactor to produce silicon which deposits upon seed particles inside the reactor. Fouling may occur as silicon deposits form on the reactor walls and interior reactor components (e.g., temperature probe, pressure tap, seed nozzle, internal supports, etc.).

FIG. 1A is a schematic diagram of a typical top head assembly 10 for a fluidized bed reactor. Assembly 10 includes a top head 20. A fluid bed reactor (FBR) member 30 (e.g., a thermocouple), pressure tap 40, and seed nozzle 50 are inserted through cooperatively-dimensioned apertures 32, 42, 52 in top head 20. Exemplary FBR members include, but are not limited to, a thermocouple, a seed pipe, a particle sampling line, a gas sampling line, a gas feed line, a heater, a second pressure tap, or a combination thereof. A second pressure tap may be used, for example, to determine pressure at a second height within the fluid bed reactor.

Components within the fluid bed reactor are subject to mechanical forces (e.g., vibratory forces from collisions with fluidized particles) during reactor operation. Accordingly, in some embodiments, top head assembly 10 further includes one or more support rods 60 and/or support rings 70 to provide stability for FBR member 30, pressure tap 40, and seed nozzle 50. In the illustrated embodiment, FBR member 30 and pressure tap 40 each have a sufficient length L to extend into a fluid bed having an upper boundary 80, which represents the average height of the fluidized bed. The lengths of FBR member 30 and pressure tap 40 may be substantially the same, or may differ. Desirably, at least the pressure tap 40 has a sufficient length to extend into the fluidized portion of the fluid bed.

FIG. 1B is an expanded view of a support ring 70 as viewed from the top. Support ring 70 includes a plurality of spacers 72, which extend radially outwardly toward and may contact a surrounding fluid bed reactor liner (not shown). Spacers 72 facilitate centering the support ring 70. Support ring 70 further includes a plurality of rings 74, individually dimensioned to accommodate and mechanically stabilize FBR member 30, pressure tap 40, seed nozzle 50, and support rods 60. Over time, damage to spacers 72 may occur from impacting the reactor liner during reactor operation and/or from impacts by fluidized particles.

FIG. 2 is a schematic diagram of top head assembly 10 illustrating deposits 90, such as silicon deposits, that can form over time during fluid bed reactor operation. As buildup increases, it becomes necessary to periodically halt reactor operation and disassemble the reactor for cleaning and/or replacement of fouled components. The maintenance delays reduce operating efficiency and product output, and incur additional operating costs. Support rods 60, support rings 70, and/or external surfaces of FBR member 30, pressure tap 40, and seed nozzle 50 also can be a source of product contamination. Accordingly, it is advantageous to reduce the number of components inserted into the fluidized bed reactor.

FIG. 3 is a schematic diagram of an exemplary top head assembly 100 including a probe assembly 110 inserted through an aperture 112 in top head 120. Aperture 112 may be centrally located in top head 120, or it may be offset from center. Probe assembly 110 includes an FBR member 130 and a pressure tap 140. Exemplary FBR members include, but are not limited to, a thermocouple, a seed pipe, a particle sampling line, a gas sampling line, a gas feed line, a heater, a second pressure tap, or a combination thereof. In some embodiments, FBR member 130 is a thermocouple. In certain arrangements, another FBR member 150, such as a seed nozzle, is inserted through another aperture 152 in top head 120. In an alternate embodiment (not shown), probe assembly 110 is inserted through an aperture in a bottom head of a fluid bed reactor.

FIGS. 4 and 5 are a schematic diagram and a cross-sectional view, respectively, of probe assembly 110. FIG. 6 is a top plan view of a support structure 160 of probe assembly 110.

FIG. 7 is a schematic diagram of one embodiment of a fluid bed reactor 200 including the top head assembly 100 of FIG. 3. The reactor 200 includes an outer wall 220 defining a reaction chamber 230. The reactor 200 further includes a nozzle 240 for introducing a reaction gas (e.g., a silicon-bearing or germanium-bearing gas) and one or more fluidization nozzles 250. The reaction chamber 230 includes a bed of particles 260, e.g., silicon or germanium particles. During reactor operation, at least a portion of the bed is fluidized. Boundary 280 represents the average height of the fluidized bed.

FBR member 130 has an outer surface 132 and a distal end 134. Pressure tap 140 has a wall 142, which defines a passageway. FBR member 130 is located within the passageway. Wall 142 is spaced apart from outer surface 132 to define a space 144 having a width W. Wall 142 has an open distal end 146. The pressure tap 140 is operable to measure the pressure within space 144. In some embodiments, a purge gas flows downward through space 144 to prevent clogging from fluidized bed particles entering the space. In some examples, the purge gas is hydrogen or an inert gas as previously described. FBR member 130 has a maximum transverse outer dimension D1, and pressure tap 140 has a maximum transverse outer dimension D2, where D2>D1. In some embodiments, FBR member 130 is centered within the passageway defined by wall 142.

Although pressure tap 140 and FBR member 130 are illustrated in FIGS. 4-5 as having circular cross-sections, one of ordinary skill in the art will understand that other shapes also may be used. For example, each of FBR member 130 and wall 142 may have a square, rectangular, ellipsoid, hexagonal, octagonal, or any other desired cross-section. Alternatively, FBR member 130 and wall 142 may have differing cross-sectional shapes so long as FBR member 130 can be inserted into the passageway defined by wall 142.

FBR member 130 has a length L1 and pressure tap 140 has a length L2. In some embodiments, each of FBR member 130 and pressure tap 140 is sufficiently long to extend into the fluidized bed, i.e., below boundary 180, 280 (which represents the average height of the fluidized bed), when probe assembly 110 is inserted through top head 120. In certain arrangements, such as the embodiments illustrated in FIGS. 3, 4 and 7, L1 is greater than L2 so that FBR member 130 extends past the distal end 146 of pressure tap 140. For example, when FBR member 130 is a thermocouple, L2 typically is greater than L1 so that the thermocouple will more accurately measure temperature in the fluid bed. In some embodiments, FBR member 130 has a distal end 134 that extends 5-100 cm beyond the distal end 146 of pressure tap 140, such as 5-50 cm, 10-50 cm, or 20-40 cm beyond the distal end 146. In one example, the distal end 134 is 25-30 cm beyond the distal end 146.

In an alternate embodiment (not shown), the FBR member 130 is shorter than the pressure tap 140 and does not extend past a distal end of the pressure tap. This arrangement may reduce or prevent product contamination from the FBR member. In one such embodiment, the FBR member 130 is a thermocouple, and the thermocouple measures the temperature within the space between the thermocouple and the pressure tap wall, such as the temperature of a purge gas flowing through the space. In some instances, the temperature within the space may be substantially the same as the bed temperature within a moderate distance above the bed. In another embodiment, the FBR member 130 is a gas feed line.

In yet another embodiment (not shown), the pressure tap further comprises an inner pipe defining a central passageway and an outer wall spaced apart from the inner pipe to define a space. In such an arrangement, the FBR member is inserted into the central passageway defined by the pressure tap's inner pipe. The inner pipe may have a length that is greater than, less than, or equal to a length of the outer wall. In one arrangement, the inner pipe has a closed distal end.

In some arrangements, a support structure 160 is provided, advantageously at or near the distal end 146 of wall 142. In one embodiment, support 160 is secured by any suitable means to distal end 146 of wall 142. The illustrated support 160 shown in FIG. 4 includes an outer member 162, a plurality of spacers, such as support rods, 164 extending inwardly from outer member 162, and an optional inner member 166. Support 160 has a maximum transverse outer dimension D3. In certain embodiments, D3 is less than or equal to D2, and desirably D3 is substantially similar to D2. There are at least two support rods 164. In some arrangements, three to five support rods 164 are present, such as four support rods 164 in the illustrated embodiment. In some embodiments, support rods 164 have a height sufficient to extend upwardly into pressure tap 140 when support 160 is secured to the distal end 146 of the pressure tap. The support 160 facilitates positioning of FBR member 130 within wall 142, and provides mechanical support for FBR member 130.

When inner member 166 is present, inner member 166 has a maximum outer transverse dimension D4 where D4≥D1 and D4<D2. Although FIG. 4 illustrates outer member 162 and inner member 166 as having circular shapes, one of ordinary skill in the art will understand that the inner member can have any shape that is capable of receiving and stabilizing FBR member 130, and the outer member can have any shape, typically a shape similar to an outer cross-sectional shape of the pressure tap. When inner member 166 is present, support rods 164 are secured rigidly to only one of outer member 162 and inner member 164 to accommodate differential thermal expansion of the components.

In an exemplary arrangement, pressure tap 140 has a larger outer transverse dimension D2 than the outer transverse dimension of a conventional pressure tap, such as pressure tap 40 in FIG. 1. In some embodiments, D2 is 2.5-6.0 cm, such as 3.0-5.0 cm. In one example, D2 is 3.5-4.0 cm. This larger transverse dimension provides probe assembly 110 with superior mechanical stability within the reactor, thereby reducing or eliminating the need for support rods and rings in some embodiments. A reduction in the number of components within the fluid bed reactor has several advantages. For example, there are fewer surfaces that can contaminate the product and/or become fouled during reactor operation, thereby reducing overall maintenance requirements. Additionally, reactor maintenance is simplified since there are fewer components requiring cleaning, disassembly, and/or replacement during maintenance operations.

Portions of probe assembly 110 that extend into the fluid bed reactor are constructed of materials capable of withstanding the pressure, temperature, and chemical conditions within the reactor. Typically, components of probe assembly 110, e.g., FBR member 130, pressure tap 140, and support 160 (if present), which extend into the fluid bed reactor comprise a metal or metals suitable for pressure vessel service at the reactor operating temperature under ASME (American Society of Mechanical Engineers) boiler and pressure vessel code. Desirably, metals that cause little or no product contamination are selected.

For fluid bed reactors for the manufacture of silicon, suitable metals include, but are not limited to, high-temperature steels, e.g., 304H or 304L stainless steel, certain nickel alloys, e.g., Incoloy® 800H, certain iron-chromium-nickel-molybdenum alloys, or cobalt-based superalloys (a cobalt-based alloy having a face-centered cubic crystal structure, and suitable for use at temperatures above 540° C. (1000° F.)). Stainless steel 304H comprises 0.04-0.1 wt % carbon, up to 2 wt % manganese, up to 0.045 wt % phosphorus, up to 0.03 wt % sulfur, up to 0.75 wt % silicon, 18-20 wt % chromium, 8-10.5 wt % nickel, up to 0.1 wt % nitrogen, with the balance being iron. Stainless steel 304L comprises up to 0.03 wt % carbon, up to 2 wt % manganese, up to 0.045 wt % phosphorus, up to 0.03 wt % sulfur, up to 0.75 wt % silicon, 18-20 wt % chromium, 8-12 wt % nickel, up to 0.1 wt % nitrogen, with the balance being iron. Incoloy® 800H is a nickel-iron-chromium alloy comprising 30-35 wt % nickel/cobalt (up to 2 wt % cobalt), 19-23 wt % chromium, up to 1 wt % silicon, up to 1.5 wt % manganese, 0.05-0.1 wt % carbon, 0.15-0.6 wt % aluminum, 0.15-0.6 wt % titanium, up to 0.015 wt % sulfur, with the balance being iron.

In some embodiments, outer surfaces of probe assembly 110 are coated to further reduce or prevent product contamination and/or to reduce or prevent exterior damage from contact with fluidized particles. For example, exposed outer surfaces of probe assembly 110 (e.g., outer surfaces that are within the fluid bed reactor) may be coated with a Stellite® alloy (a non-magnetic, corrosion-resistant cobalt-chromium alloy comprising cobalt, chromium, carbon, and optionally tungsten, molybdenum, nickel, iron, aluminum, boron, manganese, phosphorus, sulfur, silicon, and/or titanium) or tungsten carbide/cobalt (e.g., 88% WC/12% Co, 83% WC/17% Co, 86% WC/10% Co/4% Cr). In some examples, outer surfaces of probe assembly 110 are coated with Stellite® 12, which includes 26-33% (w/w) chromium, 7-9.5% (w/w) tungsten, 0.1-1.5% (w/w) molybdenum, ≤2% (w/w) silicon, 0.5-1.5% (w/w) manganese, 1.1-1.9% (w/w) carbon, ≤2.5% (w/w) iron, ≤7% (w/w) nickel, ≤1% (w/w) boron, ≤0.03% (w/w) sulfur, ≤0.03% (w/w) phosphorus, with the balance being cobalt. One embodiment of Stellite® 12 (Kennametal Stellite) comprises 29.5% (w/w) chromium, 8.5% (w/w) tungsten, 1.5% (w/w) silicon, 1% (w/w) manganese, 1.4-1.85% (w/w) carbon, ≤2.5% (w/w) iron, ≤3% (w/w) nickel, with the balance being cobalt.

In view of the many possible embodiments to which the principles of the disclosure may be applied, it should be recognized that the illustrated embodiments are only preferred examples and should not be taken as limiting the scope of the disclosure. Rather, the scope of the disclosure is defined by the following claims.

We claim:

1. A top head assembly for a fluid bed reactor, comprising:
   a top head comprising at least one aperture therethrough, wherein the top head is configured to extend across a top of a reaction chamber of a fluid bed reactor; and
   a probe assembly positioned such that it extends downwardly through the aperture into the reaction chamber when the top head assembly is installed in the fluid bed reactor, the probe assembly comprising
      a fluid bed reactor (FBR) member having an outer surface, a maximum transverse outer dimension D1, a distal end, and a length L1, and
      a pressure tap that has a wall defining a passageway, a maximum transverse outer dimension D2 where D2>D1, a distal end, and a length L2, wherein the FBR member is located within the passageway of the pressure tap, and the pressure tap wall is spaced apart from the outer surface of the FBR member to define a space between the FBR member and the pressure tap wall.

2. The top head assembly of claim 1 wherein the FBR member is a thermocouple, a seed pipe, a particle sampling line, a gas sampling line, a gas feed line, a heater, a second pressure tap, or a combination thereof.

3. The top head assembly of claim 1 wherein L1>L2 such that the distal end of the FBR member is located below the distal end of the pressure tap wall when the top head assembly is installed in the fluid bed reactor.

4. The top head assembly of claim 3 wherein the FBR member is a seed pipe, a thermocouple, a particle sampling line, a gas sampling line, a gas feed line, a heater, a second pressure tap, or a combination thereof.

5. The top head assembly of claim 1 wherein L1≤L2 such that the distal end of the FBR member is located at or above the distal end of the pressure tap wall when the top head assembly is installed in the fluid bed reactor.

6. The top head assembly of claim 5 wherein the FBR member is a seed pipe, a gas feed line, a heater, or a combination thereof.

7. The top head assembly of claim 1, further comprising a support proximate a distal end of the pressure tap wall, the support comprising:
   an outer member having a maximum transverse outer dimension D3, wherein D3≤D2; and
   a plurality of spacer rods extending inwardly from the outer member.

8. The top head assembly of claim 1 wherein the probe assembly or a portion thereof comprises high-temperature stainless steel, a nickel-iron-chromium alloy, an iron-chromium-nickel-molybdenum alloy, or a cobalt-based superalloy.

9. The top head assembly of claim 1 wherein exposed outer surfaces of the probe assembly comprise a coating comprising a cobalt-chromium alloy, tungsten carbide/cobalt, tungsten carbide/nickel boron, silicon carbide, or silicon nitride.

10. A fluid bed reactor, comprising:
    a vessel that defines a reaction chamber;
    a plurality of particles within the reaction chamber;
    a gas source in communication with the reaction chamber;
    one or more fluidization nozzles; and
    a top head assembly according to claim 1 positioned atop the reaction chamber.

11. The fluid bed reactor of claim 10 wherein the gas source is a source of a silicon-bearing gas and the reactor is configured to produce silicon-coated particles by pyrolytic decomposition of the silicon-bearing gas and deposition of silicon onto the particles.

12. The fluid bed reactor of claim 10 wherein the particles are silicon particles and the reactor is configured to produce polysilicon.

13. A fluid bed reactor configured to produce silicon-coated particles by pyrolytic decomposition of a silicon-bearing gas and deposition of silicon onto the particles, the fluid bed reactor comprising:
    a vessel that defines a reaction chamber;
    a plurality of particles within the reaction chamber;
    a source of a silicon-bearing gas in communication with the reaction chamber;
    one or more fluidization nozzles;
    a top head comprising at least one aperture therethrough, the top head located atop the reaction chamber; and
    a probe assembly positioned such that it extends downwardly through the aperture into the reaction chamber, the probe assembly comprising
       a fluid bed reactor (FBR) member having an outer surface, a maximum transverse outer dimension D1, a distal end, and a length L1, and
       a pressure tap that has a wall defining a passageway, a maximum transverse outer dimension D2 where D2>D1, a distal end, and a length L2, wherein the FBR member is located within the passageway of the pressure tap, and the pressure tap wall is spaced apart from the outer surface of the FBR member to define a space between the FBR member and the pressure tap wall.

14. The fluid bed reactor of claim 13 wherein the pressure tap wall has a sufficient length L2 that, when the fluid bed reactor is in operation such that fluidized particles are present in a fluidized portion of a fluid bed in the reaction chamber, the distal end of the pressure tap wall extends into the fluidized portion.

15. The fluid bed reactor of claim 10 wherein the FBR member is a thermocouple and L1>L2.

16. The top head assembly of claim 1, wherein the top head further comprises a second aperture extending therethrough, the top head assembly further comprising:
   a second FBR member positioned such that it extends downwardly through the second aperture into the reaction chamber.

17. The top head of assembly of claim 16 wherein the FBR member of the probe assembly is a thermocouple.

18. The top head assembly of claim 17 wherein the second FBR member is a seed nozzle.

* * * * *